(12) United States Patent
Kim et al.

(10) Patent No.: US 12,169,219 B2
(45) Date of Patent: Dec. 17, 2024

(54) APPARATUS FOR TESTING A SEMICONDUCTOR PACKAGE

(71) Applicant: TSE CO., LTD., Chungcheongnam-do (KR)

(72) Inventors: Min Cheol Kim, Chungcheongnam-do (KR); Sol Lee, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 154 days.

(21) Appl. No.: 18/153,461

(22) Filed: Jan. 12, 2023

(65) Prior Publication Data
US 2023/0384364 A1    Nov. 30, 2023

(30) Foreign Application Priority Data
May 24, 2022    (KR) .................. 10-2022-0063522

(51) Int. Cl.
*G01R 31/00*    (2006.01)
*G01R 31/28*    (2006.01)

(52) U.S. Cl.
CPC ..... *G01R 31/2862* (2013.01); *G01R 31/2863* (2013.01); *G01R 31/2865* (2013.01)

(58) Field of Classification Search
CPC ............ G01R 31/2862; G01R 31/2863; G01R 31/2865; G01R 31/2893; G01R 31/2896
See application file for complete search history.

(56) References Cited

U.S. PATENT DOCUMENTS

| 6,535,003 B2 | 3/2003 | Aldaz et al. |
| 7,724,006 B2 | 5/2010 | Kasukabe et al. |

(Continued)

FOREIGN PATENT DOCUMENTS

| CN | 1633600 A | 6/2005 |
| CN | 101148226 A | 3/2008 |

(Continued)

OTHER PUBLICATIONS

Notice of Allowance with English Translation, issued in Taiwan Application No. 112101368, dated Aug. 21, 2023, pp. 1-7, Intellectual Property Office of the Ministry of Economy in Taiwan, Da'an District, Taipei City.

*Primary Examiner* — Thang X Le
(74) *Attorney, Agent, or Firm* — Crowell & Moring LLP; John C. Freeman

(57) ABSTRACT

An apparatus for testing a semiconductor package, in which a second test circuit board, which is disposed on an upper socket assembly to form a vacuum line in the related art, is removed, and a vacuum guide including two components disposed between an upper socket and an upper package. The vacuum guide including a conductive guide member made of an inelastic insulating material disposed on a conductive region part to prevent an electrical short circuit, and a peripheral guide member made of a metallic material having rigidity and disposed on a peripheral region portion to prevent deformation of a vacuum line, such that a length of a signal path is significantly decreased, high-speed signal transmission is possible. The stable vacuum line is ensured in the upper socket assembly, and vacuum pressure from a vacuum generation device is smoothly applied to a vacuum picker.

8 Claims, 11 Drawing Sheets

(56) References Cited

U.S. PATENT DOCUMENTS

| | | |
|---|---|---|
| 9,423,451 B2 * | 8/2016 | Leung ................ G01R 31/2889 |
| 9,678,158 B2 | 6/2017 | Chen |
| 2002/0075021 A1 | 6/2002 | Aldaz et al. |
| 2008/0054261 A1 * | 3/2008 | Song ................ G01R 31/2884 |
| | | 324/754.08 |
| 2008/0075574 A1 | 3/2008 | Ahn et al. |
| 2009/0212798 A1 | 8/2009 | Kasukabe et al. |
| 2015/0260793 A1 | 9/2015 | Chen |
| 2016/0154023 A1 * | 6/2016 | Choi ................ G01R 1/0466 |
| | | 324/750.2 |
| 2017/0010324 A1 * | 1/2017 | Kim ................ G01R 31/2893 |

FOREIGN PATENT DOCUMENTS

| | | |
|---|---|---|
| KR | 10 2015 0106848 A | 9/2015 |
| KR | 10 1555965 B1 | 9/2015 |
| TW | 200937022 A | 9/2009 |
| TW | 201834104 A | 9/2018 |
| WO | WO 2013/129873 A1 | 9/2013 |

\* cited by examiner

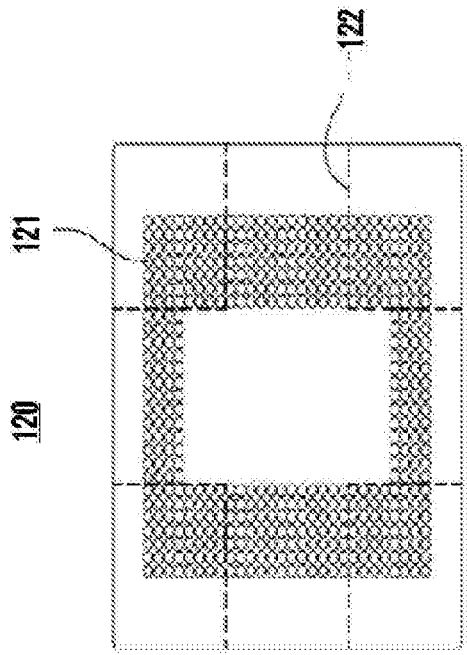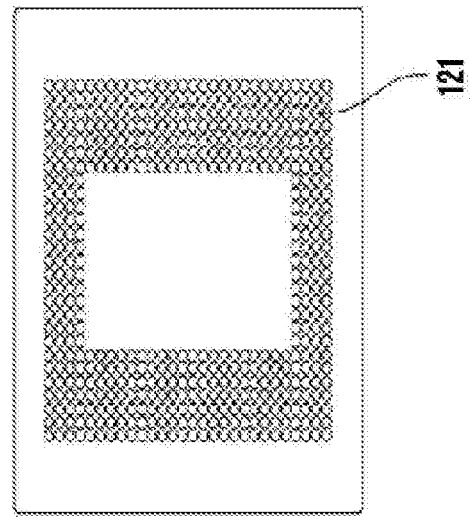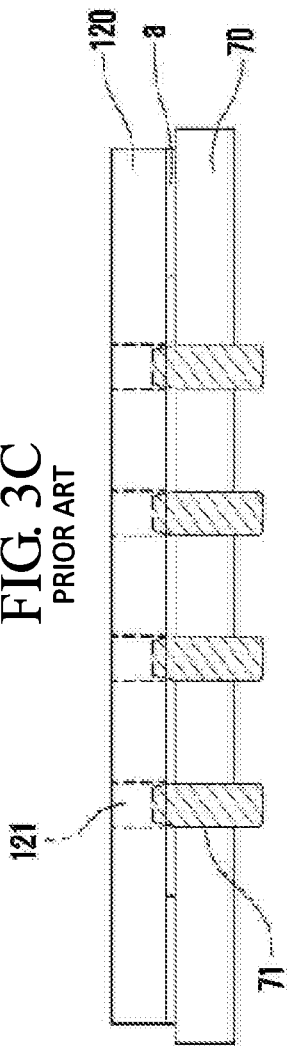

APPARATUS FOR TESTING A SEMICONDUCTOR PACKAGE

This application claims under 35 U.S.C. § 119(a) the benefit of the filing date of Korean Patent Application No. 10-2022-0063522, filed on May 24, 2022, the entire contents of which are incorporated herein by reference.

BACKGROUND OF THE INVENTION

Technical Field

The present disclosure relates to an apparatus for testing a semiconductor package, and more particularly, to an apparatus for testing a semiconductor package, which tests whether a package-on-package (POP) type semiconductor package, which is made by stacking a lower package and an upper package in an upward/downward direction, operates normally.

Background Art

In general, a semiconductor package is made by integrating fine electronic circuits with high density and subjected to a test process to test whether the electronic circuit is normal during a manufacturing process. The test process is a process of testing whether the semiconductor package operates normally and sorting the semiconductor packages into good products and defective products.

To test the semiconductor package, a test apparatus is used to electrically connect a terminal of the semiconductor package and a tester configured to apply a test signal. The test apparatus has various structures in accordance with the types of semiconductor packages that are test targets.

Recently, the use of package-on-package (POP) type semiconductor packages, which minimize sizes of components and quickly transmit signals, has been increased, and thus there is a continuously increasing demand for test apparatuses for testing the semiconductor packages.

The package-on-package type semiconductor package is made by sequentially stacking one package and another package (in a stacked manner) that perform different functions.

In the case of the package-on-package type semiconductor package, a length of a connection wire may be minimized. Therefore, a loss, such as a signal delay, impedance unconformity, or the like, which occurs when the package-on-package type semiconductor package is arranged in a two-dimensional manner, may be minimized. Further, because a vertical direction is spatially used, there is an advantage in that a mounting area per unit area may be maximized, and a high-capacity, ultra-small component may be implemented.

FIG. 1 is a view illustrating a test apparatus for testing a package-on-package type semiconductor package in the related art, and FIG. 2 is a view illustrating an operation of the test apparatus in the related art.

As illustrated in FIGS. 1 and 2, a test apparatus 1 in the related art includes: a pusher configured to be movable upward or downward by receiving power from a drive part (DP, and having a vacuum hole 51; an upper package 40 mounted in a chamber 52 of the pusher 50; a second test circuit board 20 on which the upper package 40 is mounted; an upper socket 70 coupled to an lower portion of the second test circuit board 20; a vacuum picker 80 disposed on a lower portion of the upper socket 70 and configured to pick up a lower package by a vacuum; and a lower socket 60 seated on a first test circuit board (tester) 30 (in the present specification, the first test circuit board is also referred to as a tester).

An upper socket assembly TSA includes the pusher 50, the upper package 40 coupled to the pusher 50, the second test circuit board 20 on which the upper package 40 is mounted, the upper socket 70 connected to the lower portion of the second test circuit board and the vacuum picker 80 disposed on the lower portion of the upper socket 70.

Terminals 41 are provided on a lower portion of the upper package 40. The upper package 40 is configured as a package sorted in advance as a good product. The upper package 40 is configured as a so-called golden device that may be used to test whether the lower package 10 operates normally. The lower package 10 may be a test target device having a lower terminal 11 and an upper terminal 12.

The upper and lower sockets 70 and 60 respectively have second and first conductive parts 71 and 61 provided in the form in which a plurality of conductive particles is aligned in a thickness direction in an elastic insulating material.

The lower socket 60 is mounted on the first test circuit board (tester) 30, the lower package 10 is seated on an upper surface of the lower socket 60, and the upper socket 70 is connected to the upper surface of the lower package 10. Test current applied by the tester flows through the lower package 10 and is applied to the upper package 40 through the second test circuit board 20, such that the electrical test is performed. In FIGS. 1 and 2, reference numeral 65 indicates a guide housing.

In the test apparatus 1 in the related art, the pusher 50 needs to push the lower socket in a state in which vacuum pressure is generated by a vacuum generation device VG and transferred to the vacuum picker 80, and the lower package 10 is picked up. Therefore, a vacuum needs to be maintained in a space in the pusher 50, and a vacuum line VL needs to be provided between the vacuum generation device VG and the vacuum picker 80.

In case that the upper package 40 and the upper socket 70 are connected directly to each other, the lower terminal 41 of the upper package is coupled to the second conductive part 73 of the upper socket while compressing the second conductive part 73 of the upper socket in order to form an electrical passageway between the lower terminal 41 of the upper package and the second conductive part 73 of the upper socket. Therefore, the vacuum line VL is not sufficiently formed between the upper package 40 and the upper socket 70.

Therefore, in the test apparatus 1 in the related art, the second test circuit board 20 is disposed between the upper package 40 and the upper socket 70 to form a vacuum line between the upper package 40 and the upper socket 70.

Because the lower terminal 41 of the upper package 40 is connected to a terminal (not illustrated) of the second test circuit board 20 by soldering such that the upper package 40 is mounted on the second test circuit board 20, a space, which approximately corresponds to a height of the lower terminal 41 of the upper package, is formed between a lower surface of the upper package 40 and the second test circuit board 20, and the vacuum line, through which the vacuum pressure generated by the vacuum generation device VG is transferred to the vacuum picker 80 through the space, is formed.

FIG. 2 illustrates the vacuum line VL through which the vacuum pressure generated by the vacuum generation device VG is transferred to the vacuum picker 80 through the space between the upper package 40 and the second test circuit board 20.

The vacuum pressure generated by the vacuum generation device VG is introduced through a hole 21 formed in the upper socket 70 and a central portion of the second test circuit board 20, and then the vacuum pressure is introduced into the space between the upper package 40 and the second test circuit board 20. Thereafter, the vacuum pressure is applied to the vacuum generation device VG, which is positioned outside the pusher 50, through the vacuum hole 51 and the space between the chamber 52 and the upper package 40.

However, to ensure the vacuum line VL, the test apparatus 1 in the related art need to necessarily have the second test circuit board 20 on which the upper package 40 is mounted. For this reason, a process of manufacturing the second test circuit board 20 and a process of stacking the second test circuit board 20 on the upper package 40 are required, a large amount of time is required for the manufacturing process. Further, an overall load is increased because of the installation of the second test circuit board 20, which causes a defect such as a crack in a solder ball terminal. Because of the defect, an additional test needs to be performed on the solder ball terminal of the package, which causes a problem in that the number of processes and costs are increased.

In addition, because of the installation of the second test circuit board 20, a length of a signal path between the upper package 40 and the lower package 10 is increased, which causes a signal delay and signal distortion. For this reason, there is a problem in that it is impossible to precisely test the semiconductor package that operates at high speed.

To solve the problem, recently, as illustrated in FIGS. 3A-3C, there has been considered a method of ensuring the vacuum line VL by installing an inelastic insulation sheet 120 between the upper package 40 and the upper socket 70 instead of using the second test circuit board. FIG. 3A illustrates an upper surface of the inelastic insulation sheet, FIG. 3B illustrates a lower surface of the inelastic insulation sheet, and FIG. 3C schematically illustrates a state in which the inelastic insulation sheet is coupled to the upper socket by means of a bonding agent.

The inelastic insulation sheet 120 has a sheet shape having an upper surface facing the upper package 40, and a lower surface facing the upper socket 70. The inelastic insulation sheet 120 has a plurality of through-holes 121 formed at positions corresponding to the lower terminals 41 from the upper package and the second conductive parts 71 so that the lower terminals 41 of the upper package and the second conductive parts 71 of the upper socket 70 are connected to the through-holes 121. A vacuum passageway 122 is formed in a lower surface of the inelastic insulation sheet 120 facing the upper socket 70 and has a shape in which a concave groove is elongated or a cross shape in which elongated concave grooves intersect each other, such that the vacuum line VL is ensured between the upper package 40 and the upper socket 70.

Because the inelastic insulation sheet 120 is used instead of the second test circuit board 20, the length of the signal path between the upper package and the lower package is significantly decreased, which makes it possible to prevent the signal delay and signal distortion related to high-speed signal transmission and precisely test the semiconductor package that operates at high speed. Therefore, it is possible to efficiently perform the electrical property test and significantly reduce the test costs and time.

However, the technology for ensuring the vacuum line by using the inelastic insulation sheet configured as a single component has the following problems.

In case that the inelastic insulation sheet is made of polyimide film, FR4, or engineering plastic that is an insulating material, a region for supporting the inelastic insulation sheet between the upper package and the upper socket is insufficient, because depth processing for processing the concave groove is performed to form the vacuum passageway. For this reason, the inelastic insulation sheet is easily deformed, the deformation eliminates the vacuum passageway, and the vacuum pressure for picking up the lower package is not sufficiently transferred to the vacuum picker, which causes a problem in that a pick-up error occurs when the vacuum picker picks up the lower package.

Therefore, to prevent the deformation of the vacuum line, it is possible to consider that the inelastic insulation sheet is made of a metallic material, and the through-hole portion is at least plated with an insulating material to prevent a short circuit between the terminal of the upper package and the metallic material of the inelastic insulation sheet. However, in many cases, the insulation plating is not properly performed on a deep portion of the through-hole. Further, when an insulation plating layer repeatedly comes into contact with the lower terminal of the upper package, the insulation plating layer is damaged by burrs produced when the through-hole is processed, which causes a problem in that an electrical short circuit occurs between the lower terminal of the upper package and the metallic material.

In addition, as schematically illustrated in FIG. 3C, the upper socket and the inelastic insulation sheet are vacuum-sealed to prevent a leak of vacuum pressure by bonding edge portions of the upper socket and the inelastic insulation sheet by using a bonding agent (a) such as a double-sided tape. A portion of the second conductive part of the upper socket cannot be inserted into and supported by the through-hole of the inelastic insulation sheet by a thickness of the bonding agent, and the portion of the second conductive part is easily deformed. For this reason, there are problems in that the second conductive part is damaged, and a defective connection with the lower terminal of the upper package occurs.

DOCUMENTS OF RELATED ART (Patent Document 1) Korean Patent Application Laid-Open No. 2015-0106848 (published on Sep. 22, 2015)
(Patent Document 2) Korean Patent No. 10-1555965 (registered on Sep. 25, 2015)

SUMMARY OF THE INVENTION

The present disclosure has been made in an effort to solve the above-mentioned problems, and an object of the present disclosure is to provide an apparatus for testing a semiconductor package, in which a stable vacuum line may be ensured by a vacuum guide means including two components even though a second test circuit board is eliminated from an apparatus for testing a package-on-package type semiconductor.

To achieve the above-mentioned object, the present disclosure provides a test apparatus including: a lower socket mounted on a tester configured to provide a test signal, the lower socket having a plurality of first conductive parts configured to electrically connect a lower package to the tester by being connected to lower terminals of the lower package; a pusher coupled to the upper package and having a vacuum hole through which vacuum pressure of a vacuum generation device is transferred, the pusher being configured to be movable toward or away from the lower socket by receiving power from a drive part; an upper socket coupled to the pusher and including an insulation pad made of an inelastic insulating material, and a plurality of second conductive parts supported on the insulation pad and each having one end connected to the lower terminal of the upper package, and the other end connected to an upper terminal of the lower package, the upper socket having a conductive region part configured to surround the plurality of second conductive parts, and a peripheral region portion positioned at the periphery of the conductive region part; a vacuum picker coupled to a lower portion of the upper socket and having an insulation pad hole formed at a center of the upper socket so that the vacuum pressure is transferred through the insulation pad hole; and a vacuum guide means installed between the upper package and the upper socket, in which the vacuum guide means includes: a conductive guide member having a region corresponding to the conductive region part and having through-holes formed at positions corresponding to the second conductive parts and the lower terminals of the upper package, the conductive guide member being made of an inelastic insulating material; and a peripheral guide member made of a metallic material and having an insertion groove into which the conductive guide member is inserted, in which a first vacuum space portion having a concave groove shape and connected to the vacuum hole is formed in a lower surface of the conductive guide member, and in which a second vacuum space portion having a concave groove shape and connected to the vacuum hole is formed in a lower surface of the peripheral guide member.

The vacuum pressure of the vacuum generation device may be applied to the vacuum picker through the vacuum hole, the second vacuum space portion, the first vacuum space portion, and the insulation pad hole.

One or more deformation prevention portions may be formed on the first vacuum space portion and the second vacuum space portion and each have a height that compensates for the concave groove.

The conductive guide member may have a thickness that allows the lower terminal of the upper package and the second conductive part to be connected to each other in the through-hole.

A thickness of the conductive guide member may be larger than a thickness of the peripheral guide member.

The conductive guide member may be mounted on a lower surface of the upper package, and the peripheral guide member may be mounted on an upper surface of the upper socket.

The inelastic insulating material may be any one of polyimide film, FR4, or engineering plastic.

The upper socket may be coupled to a lower portion of the pusher in a vacuum sealing manner.

According to the test apparatus according to the present disclosure, the second test circuit board disposed on the upper socket assembly in the related art may be removed, and the vacuum guide having the vacuum space portion is installed between the upper socket and the upper package, which makes it possible to ensure the vacuum line in the upper socket assembly and smoothly apply the vacuum pressure from the vacuum generation device to the vacuum picker.

In addition, the vacuum guide includes the two components including the conductive guide member and the peripheral guide member, and the conductive guide member made of an inelastic insulating material is disposed on the contact portion with the lower terminal of the upper package, which makes it possible to basically prevent a likelihood of occurrence of a short circuit between the vacuum guide means and the lower terminal of the upper package.

In addition, the vacuum guide includes the two components including the conductive guide member and the peripheral guide member, and the conductive guide member made of an inelastic insulating material is disposed on the contact portion with the lower terminal of the upper package, such that the lower terminal of the upper package may softly come into contact with the conductive guide member, which makes it possible to prevent damage to the lower terminal of the upper package in comparison with the case in which the conductive guide member is made of a metallic material in the related art.

In addition, the vacuum guide includes the two components including the conductive guide member and the peripheral guide member, and the peripheral guide member made of a metallic material having rigidity is disposed on the portion to which the vacuum pressure transferred through the vacuum hole of the pusher is directly applied, which makes it possible to prevent the vacuum line from being deformed or eliminated. Therefore, it is possible to transfer sufficient vacuum pressure to the vacuum picker and prevent a pick-up error when the vacuum picker picks up the lower package.

In addition, the vacuum guide may include the two components including the conductive guide member and the peripheral guide member, such that the thickness of the conductive guide member may be larger than the thickness of the peripheral guide member. Therefore, the thickness of the through-hole, which supports and guides the second conductive part of the upper socket, may be increased, and the entire upper bump of the second conductive part may be accommodated in the through-hole. Therefore, it is possible to prevent the deformation of the second conductive part and implement the stable connection with the lower terminal of the upper package.

In addition, the vacuum guide according to the present disclosure may be used instead of the second test circuit board in the related art, such that the length of the signal path between the upper package and the lower package is significantly decreased, which makes it possible to prevent the signal delay and signal distortion related to high-speed signal transmission and precisely test the semiconductor package that operates at high speed.

BRIEF DESCRIPTION OF THE DRAWINGS

FIGS. 3A-C are views illustrating an inelastic insulation sheet in the related art, in which FIG. 3A is a view illustrating an upper surface, FIG. 3B is a view illustrating a lower surface, and FIG. 3C is a view schematically illustrating a coupling relationship between an inelastic insulation sheet and an upper socket.

FIGS. 6A-6B are views illustrating a vacuum guide means having a conductive guide member and a peripheral guide member according to the embodiment of the present disclosure, in which FIG. 6A is a view illustrating an upper surface, and FIG. 6B is a view illustrating a lower surface.

FIGS. 7A-7B are views view illustrating the conductive guide member according to the embodiment of the present disclosure, in which FIG. 7A is a view illustrating an upper surface, and FIG. 7B is a view illustrating a lower surface and an enlarged view of a part of the lower surface.

FIGS. 8A-8B are views illustrating the peripheral guide member according to the embodiment of the present disclosure, in which FIG. 8A is a view illustrating an upper surface, and FIG. 8B is a view illustrating a lower surface and an enlarged view of a part of the lower surface.

DETAILED DESCRIPTION OF THE INVENTION

Figure 1:
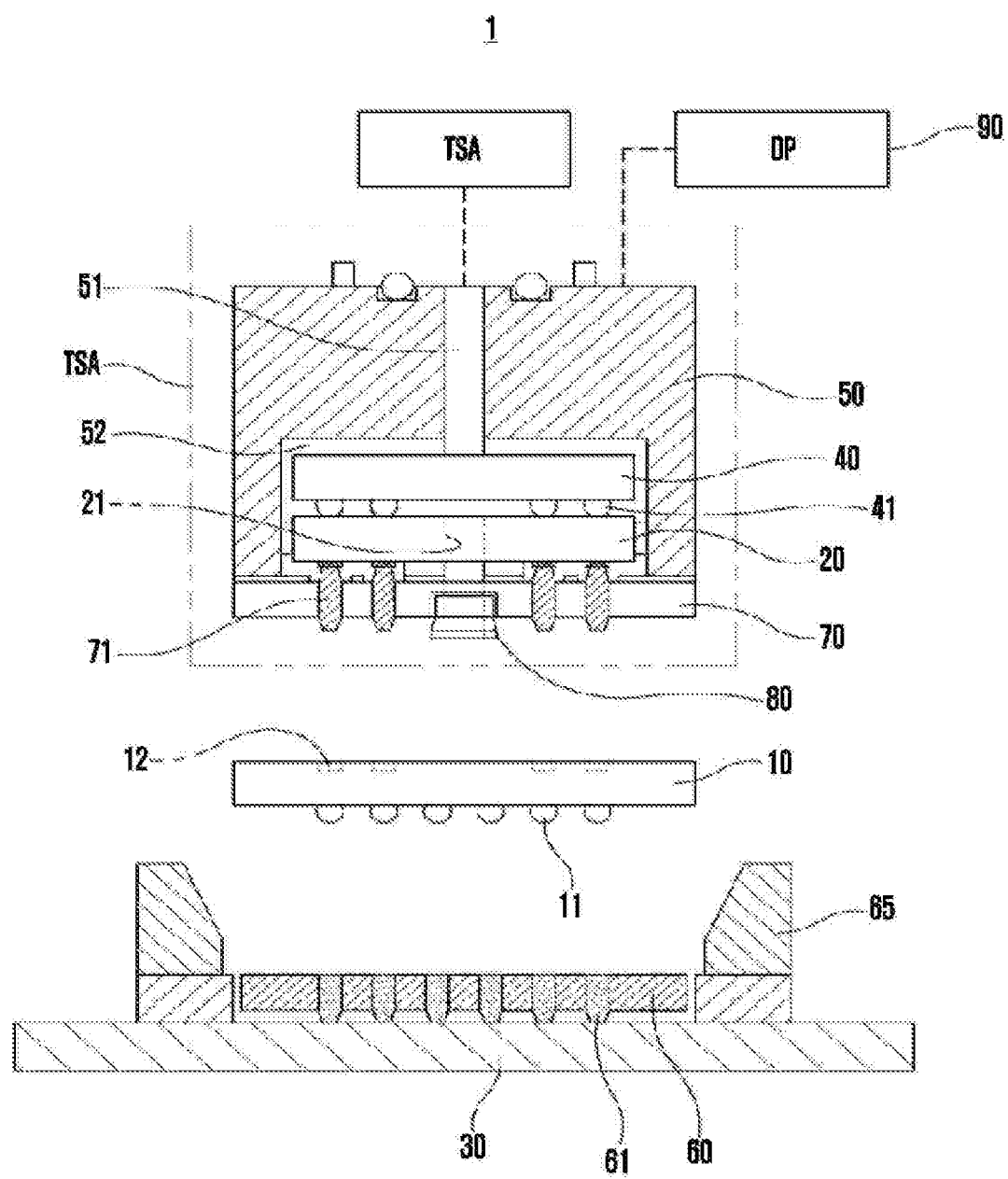
FIG. 1 is a view illustrating a test apparatus for testing a package-on-package type semiconductor package in the related art.
Figure 2:
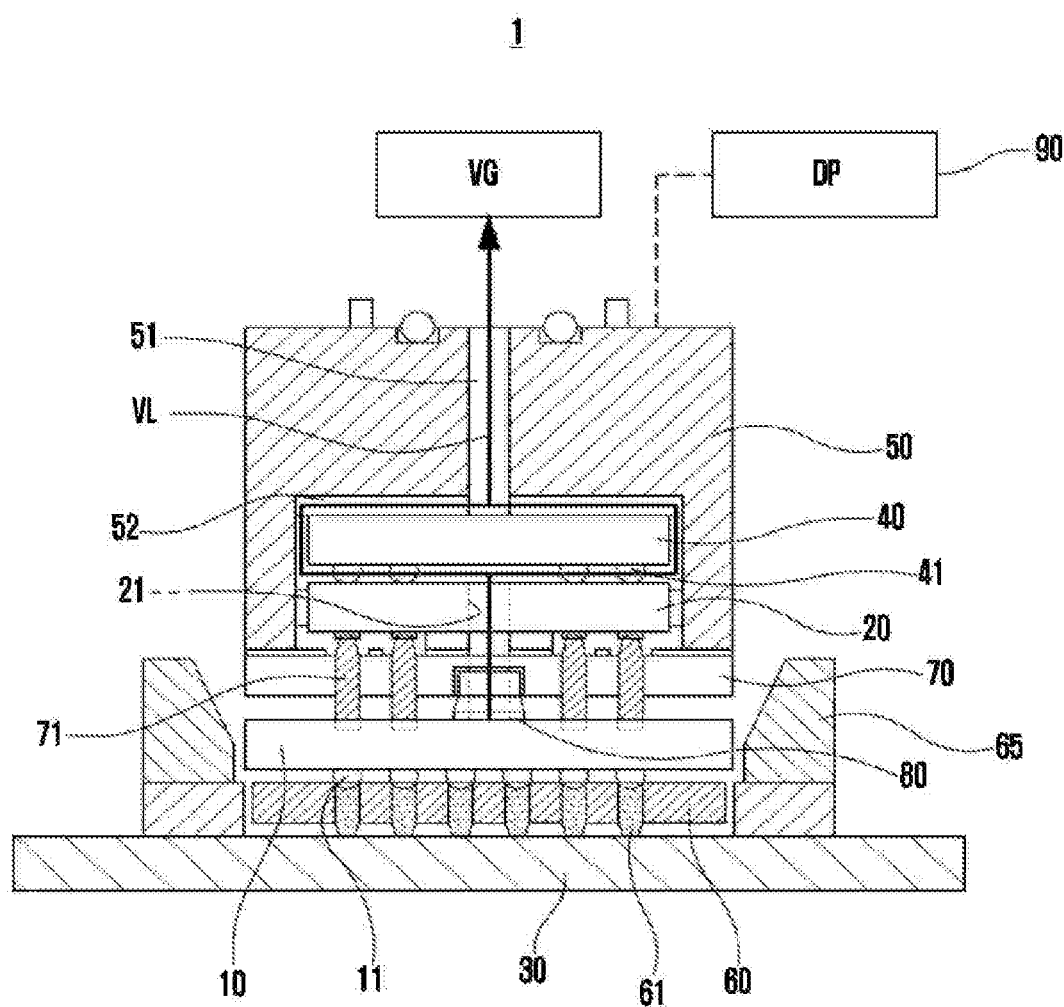
FIG. 2 is a view illustrating an operation of the test apparatus in the related art.

Hereinafter, a test apparatus according to an embodiment of the present disclosure will be described in detail with reference to the accompanying drawings.

The present disclosure may be variously modified and may have various exemplary embodiments, and particular exemplary embodiments illustrated in the drawings will be described in detail below.

However, the description of the exemplary embodiments is not intended to limit the present disclosure to the particular exemplary embodiments, but it should be understood that the present disclosure is to cover all modifications, equivalents and alternatives falling within the spirit and technical scope of the present disclosure.

When one constituent element is described as being "coupled" or "connected" to another constituent element, it should be understood that one constituent element can be coupled or connected directly to another constituent element, and an intervening constituent element can also be present between the constituent elements. When one constituent element is described as being "coupled directly to" or "connected directly to" another constituent element, it should be understood that no intervening constituent element is present between the constituent elements.

The terms used in the present specification are used only for the purpose of describing particular embodiments and are not intended to limit the present disclosure. Singular expressions include plural expressions unless clearly described as different meanings in the context.

In the present specification, it should be understood the terms "comprises," "comprising," "includes," "including," "containing," "has," "having" or other variations thereof are inclusive and therefore specify the presence of stated features, integers, steps, operations, elements, components, or combinations thereof, but do not preclude the presence or addition of one or more other features, integers, steps, operations, elements, components, or combinations thereof.

The terms such as "first" and "second" may be used to describe various constituent elements, but the constituent elements should not be limited by the terms. These terms are used only to distinguish one constituent element from another constituent element.

In addition, the constituent elements of the embodiment described with reference to the drawings are not restrictively applied to the corresponding embodiment but may be implemented to be included in another embodiment within the scope in which the technical spirit of the present disclosure is maintained. In addition, even though a separate description is omitted, the constituent elements may, of course, be implemented in one embodiment made by combining a plurality of embodiments.

In addition, in the description of the exemplary embodiments with reference to the accompanying drawings, the same constituent elements will be designated by the same or relevant reference numerals regardless of reference numerals, and a duplicated description thereof will be omitted. In the description of the present disclosure, the specific descriptions of publicly known related technologies will be omitted when it is determined that the specific descriptions may unnecessarily obscure the subject matter of the present disclosure.

Figure 4:
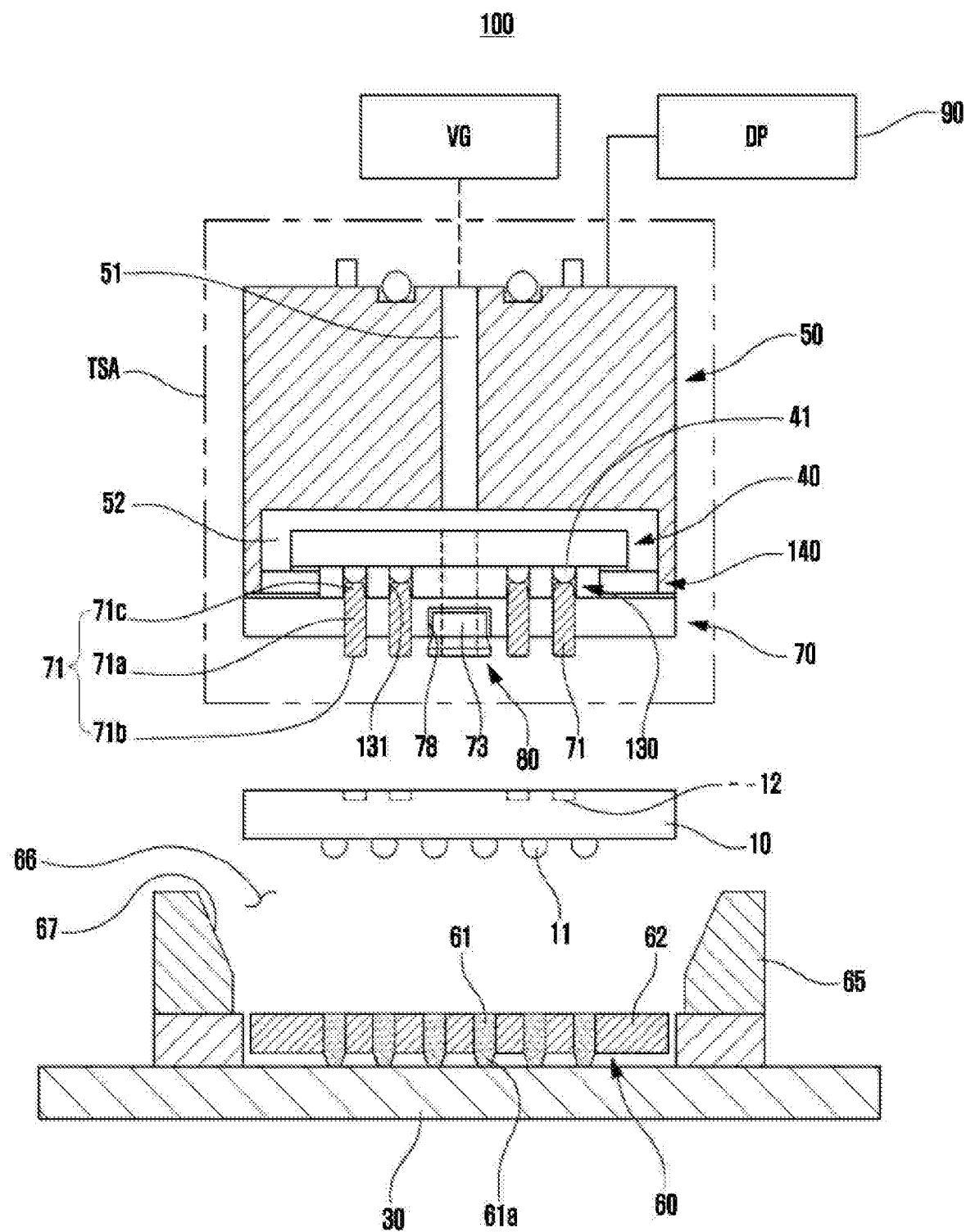
FIG. 4 is a view illustrating a test apparatus according to an embodiment of the present disclosure.
Figure 5:
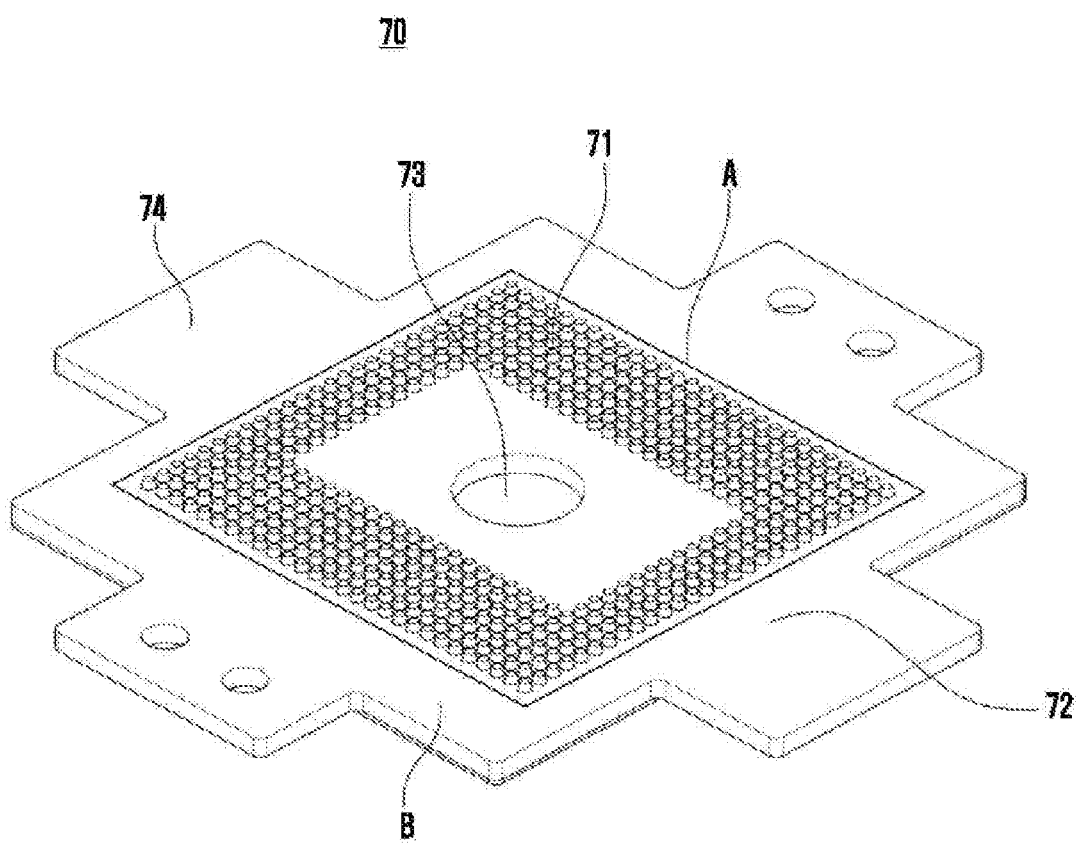
FIG. 5 is a perspective view illustrating an upper socket according to the embodiment of the present disclosure.
Figure 6B:
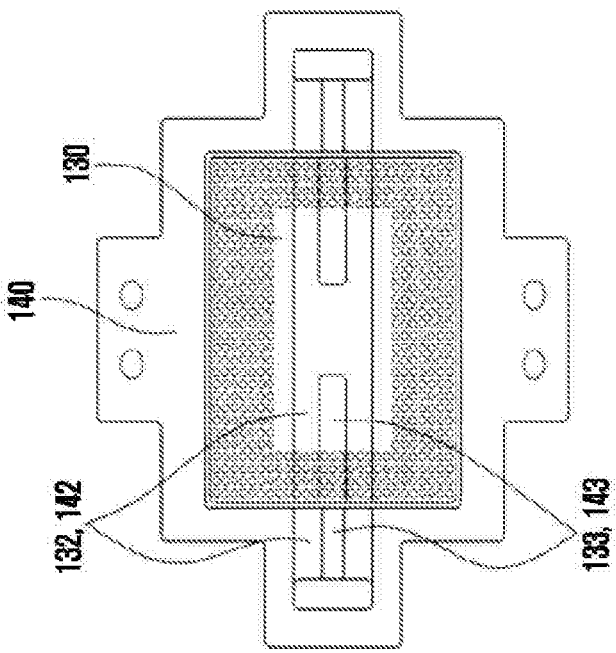
Figure 6A:
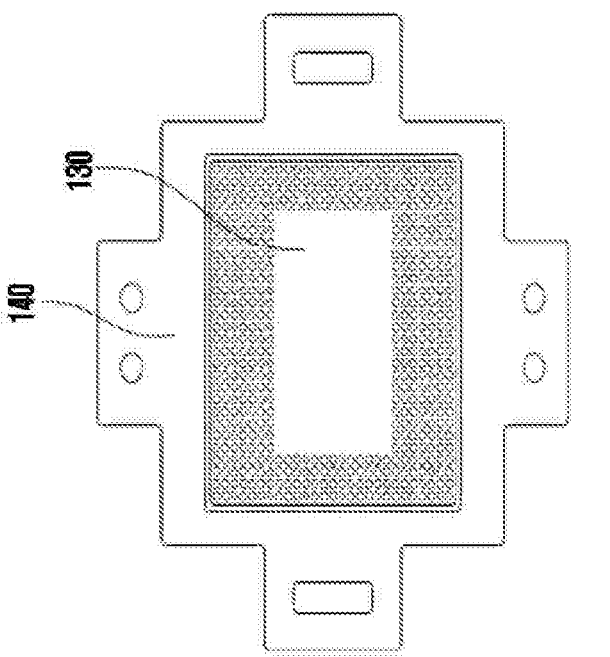
Figure 7B:
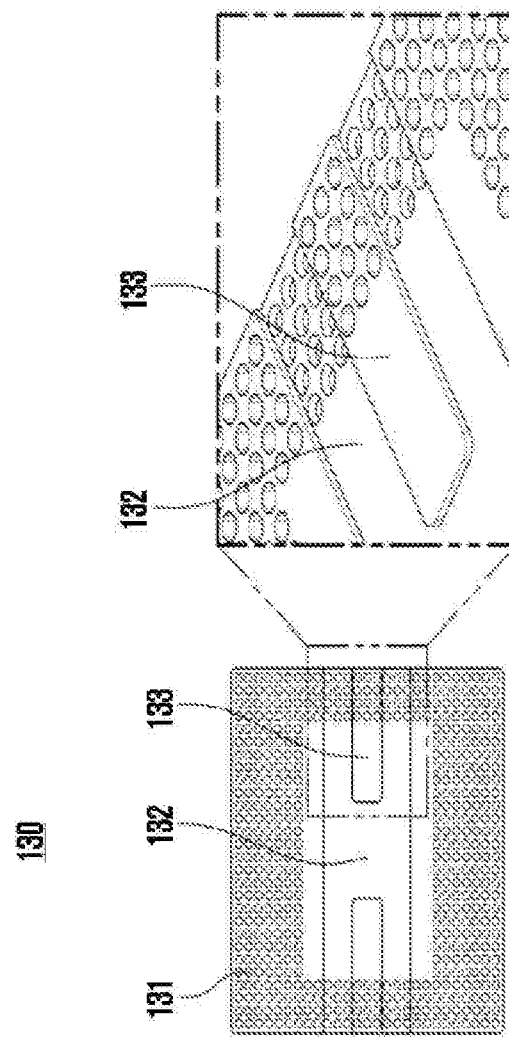
Figure 7A:
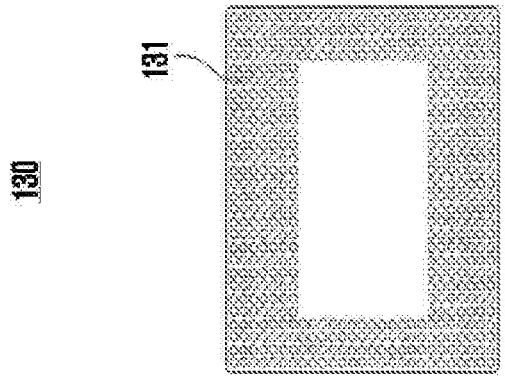
Figure 8A:
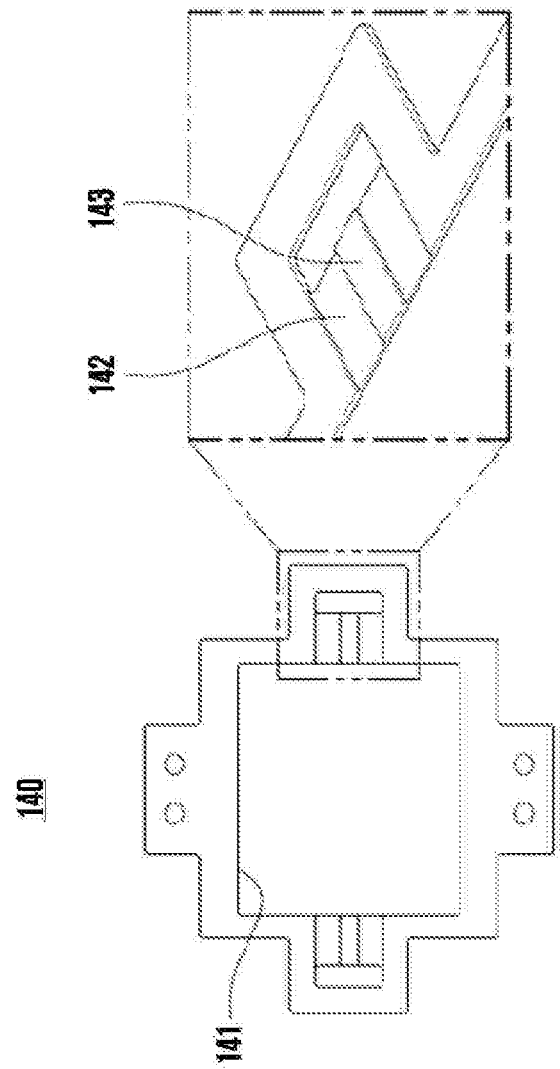
Figure 8B:
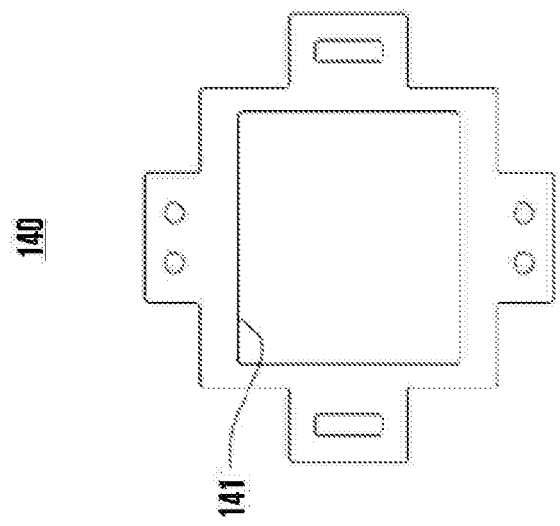
Figure 9:
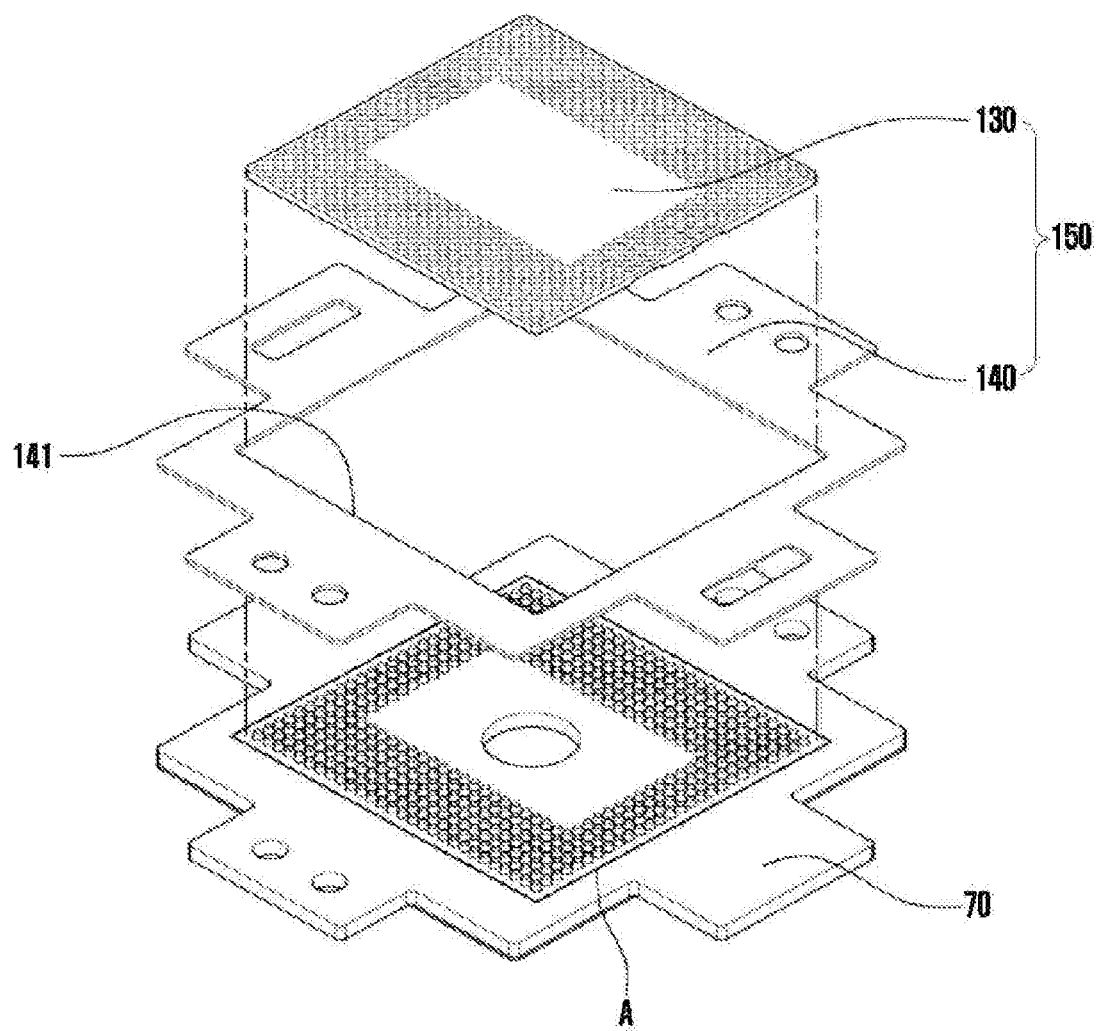
FIG. 9 is a view illustrating a coupling relationship between the conductive guide member, the peripheral guide member, and the upper socket according to the embodiment of the present disclosure.
Figure 10:
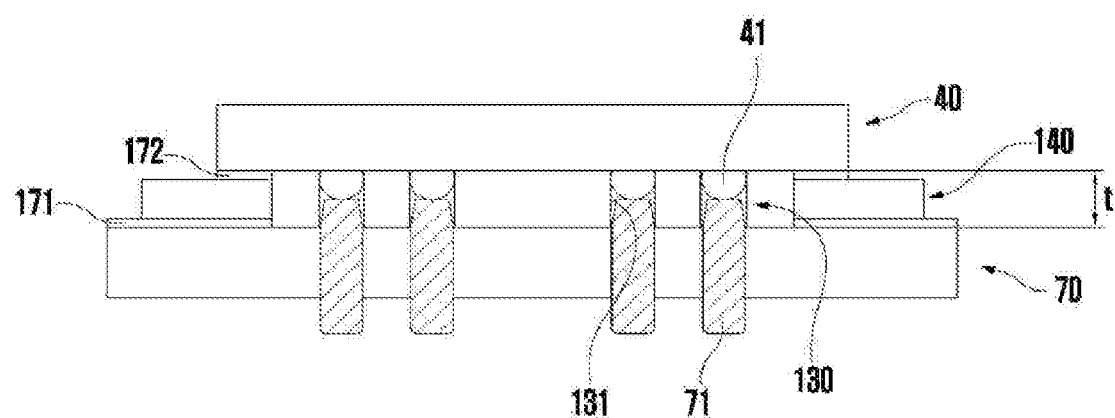
FIG. 10 is a view schematically illustrating a coupling relationship between an upper package, the vacuum guide means, and the upper socket according to the embodiment of the present disclosure.
Figure 11:
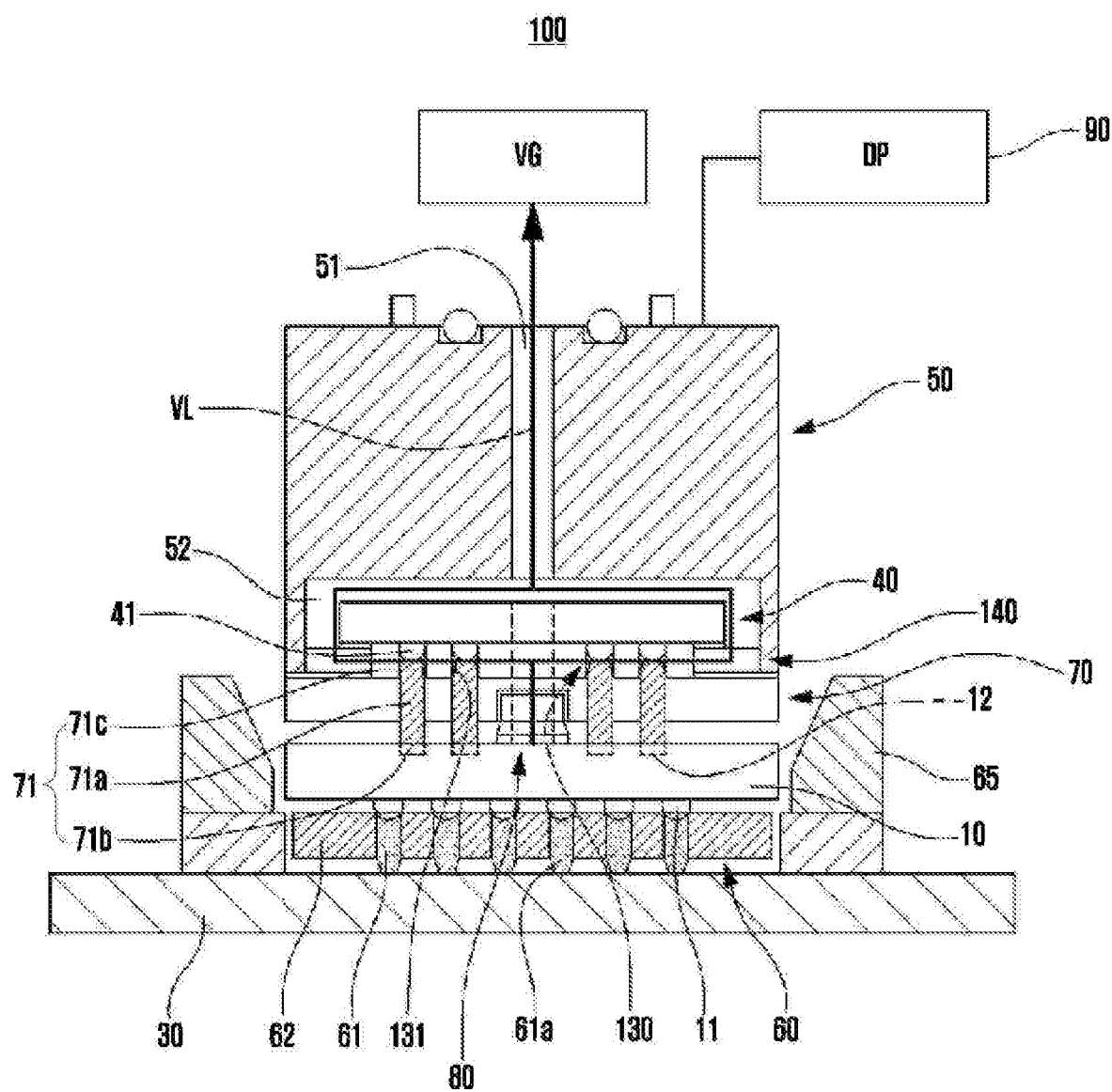
FIG. 11 is a view illustrating an operation of the test apparatus according to the embodiment of the present disclosure.

FIG. 4 is a view illustrating a test apparatus according to an embodiment of the present disclosure; FIG. 5 is a perspective view illustrating an upper socket according to the embodiment of the present disclosure; FIGS. 6A-6B are views illustrating a vacuum guide means having a conductive guide member and a peripheral guide member according to the embodiment of the present disclosure, in which FIG. 6A is a view illustrating an upper surface, and FIG. 6B is a view illustrating a lower surface; FIGS. 7A-7B are views view illustrating the conductive guide member according to the embodiment of the present disclosure, in which FIG. 7A is a view illustrating an upper surface, and FIG. 7B is a view illustrating a lower surface and an enlarged view of a part of the lower surface; FIGS. 8A-8B are views illustrating the peripheral guide member according to the embodiment of the present disclosure, in which FIG. 8A is a view illustrating an upper surface, and FIG. 8B is a view illustrating a lower surface and an enlarged view of a part of the lower surface; FIG. 9 is a view illustrating a coupling relationship between the conductive guide member, the peripheral guide member, and the upper socket according to the embodiment of the present disclosure; FIG. 10 is a view schematically illustrating a coupling relationship between an upper package, the vacuum guide means, and the upper socket according to the embodiment of the present disclosure; and FIG. 11 is a view illustrating an operation of the test apparatus according to the embodiment of the present disclosure.

As illustrated in the drawings, a test apparatus 100 according to an embodiment of the present disclosure is used to test a package-on-package (POP) type semiconductor package and tests a lower package 10 by using an upper package 40, which is sorted in advance as a good product, or simultaneously test the upper package and the lower package. The apparatus 100 may electrically mediate the package-on-package (POP) type semiconductor package and the tester 30 configured to generate test signals.

The test apparatus 100 according to the embodiment of the present disclosure includes: a lower socket 60 mounted on a tester 30 configured to provide a test signal, the lower socket 60 having a plurality of first conductive parts 61 configured to electrically connect a lower package 10 to the tester 30 by being connected to lower terminals 11 of the lower package 10; a pusher 50 coupled to the upper package 40 and having a vacuum hole 51 through which vacuum pressure of the vacuum generation device VG is transferred, the pusher 50 being configured to be movable toward or away from the lower socket 60 by receiving power from a drive part (DP, 90); an upper socket 70 coupled to the pusher 50 and including an insulation pad 72 made of an inelastic insulating material, and a plurality of second conductive parts 71 supported on the insulation pad 72 and each having one end connected to the lower terminal 41 of the upper package, and the other end connected to an upper terminal 12 of the lower package, the upper socket 70 having a conductive region part A configured to surround the plurality of second conductive parts 71, and a peripheral region portion B positioned at the periphery of the conductive region part; a vacuum picker 80 coupled to a lower portion of the upper socket 70 and having an insulation pad hole 73 formed at a center of the upper socket so that the vacuum pressure is transferred through the insulation pad hole 73; and a vacuum guide 150 installed between the upper package 40 and the upper socket 70. The vacuum guide 150 includes: a conductive guide member 130 having a region corresponding to the conductive region part and having through-holes 131 formed at positions corresponding to the second conductive parts 71 and the lower terminals 41 of the upper package, the conductive guide member 130 being made of an inelastic insulating material; and a peripheral guide member 140 made of a metallic material and having an insertion groove 141 into which the conductive guide member 130 is inserted. A first vacuum space portion 132 having a concave groove shape and connected to the vacuum hole 51 is formed in a lower surface of the conductive guide member 130, and a second vacuum space portion 142 having a concave groove shape and connected to the vacuum hole 51 is formed in a lower surface of the peripheral guide member 140.

An upper socket assembly TSA includes the pusher 50, the upper package 40 mounted on the pusher 50, the upper socket 70 coupled to the lower portion of the upper package 40, and the vacuum picker 80 disposed on the lower portion of the upper socket 70.

The constituent elements of the test apparatus 100 according to the embodiment of the present disclosure will be specifically described. First, the lower socket 60 is mounted on the tester 30 and electrically connects the tester 30 and the lower package 10.

The lower socket 60 may include the first conductive parts 61 and an insulation part 62. The first conductive part 61 is provided in the form in which a plurality of conductive particles is aligned in a thickness direction in an elastic insulating material. The plurality of first conductive parts 61 is disposed inside the insulation part 62 and spaced apart from one another so as to correspond to the lower terminals 11 of the lower package 10 that are connection targets.

One end of the first conductive part 61 comes into contact with a signal electrode (not illustrated) provided on the tester 30, and the other end of the first conductive part 61 is connected to the lower terminal 11 of the lower package 10.

The first conductive part 61 may include a first conductive part bump 61a protruding from a lower portion of the insulation part 62. During the device test, the first conductive part bump 61a is compressed against a signal electrode provided on the tester 30, such that the first conductive part bump 61a may more stably come into contact with the signal electrode.

A polymer material having heat resistance and a cross-linking structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester-based rubber, epichlorohydrin rubber, ethylene-propylene copolymer rubber, ethylene-propylene-diene copolymer rubber, soft liquid epoxy rubber, or the like may be used as an elastic insulating material that constitutes the first conductive part 61.

A material, which has magnetism so as to react with a magnetic field, may be used as the conductive particle that constitutes the first conductive part 61. For example, particles of metal having magnetism, such as iron, nickel, or cobalt, particles of an alloy thereof, particles containing metal, materials each having a core particle having a surface plated with metal excellent in conductivity such as gold, silver, palladium, or radium, inorganic particles such as non-magnetic metal particles or glass beads, materials each having a polymer particle, as a core particle, having a surface plated with a conductive magnetic element such as nickel and cobalt, or materials each having a core particle plated with a conductive magnetic element and metal excellent in conductivity may be used as the conductive particles.

The insulation part 62 insulates a portion between the first conductive parts 61 and defines an external appearance of the lower socket 60. The insulation part 62 serves to support the first conductive part 61 when the first conductive part 61 receives a contact load. The insulation part 62 may be made of an elastic insulating material identical to the elastic insulating material of the first conductive part 61.

In addition to the elastic insulating material, the material of the insulation part 62 may, of course, be an inelastic insulating material or other various insulating materials capable of insulating the portion between the first conductive parts 61.

In addition, a guide housing 65 is installed on the lower socket 60. The guide housing 65 has an accommodation groove 66 that may accommodate the lower package 10. The accommodation groove 66 may penetrate the guide housing 65 in an upward/downward direction. The lower package 10 may reach the lower socket 60 through the accommodation groove 66 of the guide housing 65.

The guide housing 65 has an inclined surface 67. The inclined surface 67 may guide the pusher 50 that moves downward toward the lower socket 60. That is, when the pusher 50 on which the upper socket 70 is mounted moves toward the lower socket 60 in a state in which the pusher 50 is tilted toward one side, the pusher 50 may come into contact with the inclined surface 67 and be guided along the inclined surface 67. Therefore, the pusher 50 may align the upper package 40 with an exact position on the lower package 10.

The pusher 50 may move toward the lower socket 60 or move away from the lower socket 60 by receiving power from the drive part (DP, 90). The chamber 52 capable of accommodating the upper package 40 is provided in the pusher 50. The vacuum hole 51 for transferring the vacuum pressure is provided in the pusher 50.

The pusher 50 is connected to the external vacuum generation device VG through the vacuum hole 51, such that the vacuum pressure generated by the vacuum generation device may be transferred to the vacuum picker 80 through the chamber 52.

In the state in which the upper socket 70 and the upper package 40 are coupled, the pusher 50 is moved by the drive part 90 to connect the upper socket 70 to the lower package 10 placed on the lower socket 60 or separate the upper socket 70 from the lower package 10. In addition, when the pusher 50 moves toward the lower socket 60 or moves away from the lower socket 60, the vacuum picker 80 may be used to load the lower package 10 onto the lower socket 60 or unload the lower package 10 from the lower socket 60.

The upper socket 70 is disposed on the lower portion of the pusher 50, and the upper socket 70 is electrically connected to the upper package 40 placed in the chamber 52 of the pusher 50. The upper package 40 is configured as a package sorted in advance as a good product. The upper package 40 is configured as a so-called golden device that may be used to test whether the lower package 10 operates normally.

As illustrated in FIG. 5, the upper socket 70 may include the insulation pad 72 configured to cover the chamber 52, and the plurality of second conductive parts 71 supported by the insulation pad 72. The upper socket 70 includes the conductive region part A having a quadrangular shape and configured to surround the plurality of second conductive parts 71, and the peripheral region portion B positioned at the periphery of the conductive region part A, configured to support the conductive region part A, and coupled to the pusher 50.

The insulation pad 72 may be made of an inelastic insulating material. The insulation pad 72 made of an inelastic insulating material is advantageous in pushing the lower package 10 against the lower socket 60 when the upper socket 70 comes into contact with the lower package 10. When the insulation pad 72 stably pushes the lower package 10, the lower terminals 11 of the lower package 10 may be stably connected to the first conductive parts 61 of the lower socket 60.

The insulation pad 72 made of an inelastic insulating material may have bendable properties even though the insulation pad 72 is not easily elastically deformed, unlike an elastic insulation part of a silicone rubber socket in the related art. These properties are advantageous in improving durability and lifespan and improving a resistive force against a test target device having warpage having various shapes. The insulation pad 72 may be made of polyimide (PI), engineering plastic, or other various inelastic insulating materials.

The insulation pad 72 has the insulation pad hole 73. The insulation pad hole 73 is formed in the central portion of the upper socket 70 and connected to the chamber 52 so that the vacuum pressure of the chamber 52 is transferred. A vacuum picker insertion groove 78 may be provided in the lower portion of the insulation pad hole 73 of the insulation pad 72, and the vacuum picker 80 may be inserted into the vacuum picker insertion groove 78, such that a space in which the vacuum picker 80 may move may be provided.

The second conductive part 71 penetrates the insulation pad 72 in the thickness direction and is supported by the insulation pad 72. One end of the second conductive part 71 may come into contact with the lower terminal 41 of the upper package 40, and the other end of the second conductive part 71 may be connected to the upper terminal 12 of the lower package 10.

The second conductive part 71 may include: a second conductive part body 71a placed in the insulation pad 72, a second conductive part lower bump 71b connected to the second conductive part body 71a and protruding from a lower surface of the insulation pad 72, and a second conductive part upper bump 71c connected to the second conductive part body 71a and protruding from an upper surface of the insulation pad 72. When the upper socket 70 approaches the lower socket 60, the second conductive part lower bump 71b may stably come into contact with the upper terminal 12 by being compressed against the upper terminal 12 of the lower package 10, and the second conductive part upper bump 71c may more stably come into contact with the lower terminal 41 because the second conductive part upper bump 71c may be compressed and coupled to the lower terminal 41 of the upper package in the through-hole 131 of the conductive guide member 130 to be described below. The second conductive part lower bump 71b and the second conductive part upper bump 71c may be provided to implement stable contact with the terminals. However, the second conductive part lower bump 71b and the second conductive part upper bump 71c may not be provided. Alternatively, only any one of the second conductive part lower bump 71b and the second conductive part upper bump 71c may be provided.

The second conductive part 71 may be provided in the form in which a plurality of conductive particles is contained in an elastic insulating material. The elastic insulating material and the conductive particle, which constitute the second conductive part 71, may be identical to the elastic insulating material and the conductive particle that constitute the first conductive part 61.

The upper socket 70 may be bonded to the pusher 50 by a bonding agent, and the bonded portion may be vacuum-sealed, such that the vacuum pressure between the upper socket 70 and the pusher 50 does not deteriorate. The upper package 40 may also be configured to be bonded to the chamber 52 by a bonding agent.

Various bonding agents such as a double-sided tape or a liquid quick-drying bonding agent may be used as the bonding agent. A bonding force of the bonding agent may be set to sufficiently withstand the vacuum pressure even though the vacuum pressure is transferred to the vacuum picker. Typically, the bonding agent having the bonding force within a range of 300 to 2,000 gf/in may be used.

As described above, the structure in which the constituent elements of the upper socket assembly are coupled by the bonding agent is adopted, which makes it easy to separate and couple the upper package. Further, it is possible to obtain an effect of mitigating impact because the bonding agent absorbs a part of impact that occurs when the upper socket assembly comes into contact with the lower package.

Further, a typical solder ball type may be used for the lower terminal 41 of the upper package 40 or the lower terminal 11 of the lower package 10. However, a land type made by grinding and flattening a solder ball may of course be used.

Further, the vacuum picker 80 may be mounted on the lower portion of the upper socket 70 and pick up the lower package 10 by a vacuum. The vacuum picker 80 is connected to the insulation pad hole 73 of the upper socket 70. The vacuum picker insertion groove 78 may be provided in the upper package 40 so that the vacuum picker 80 may pick up or push the lower package 10, such that the space in which the vacuum picker 80 may move may be provided.

As illustrated in FIGS. 4 and 11, the vacuum guide 150 is installed between the upper package 40 and the upper socket 70.

As illustrated in FIGS. 6A-6B to 8A-8B, the vacuum guide 150 includes the two components including: the conductive guide member 130 having the region corresponding to the conductive region part A of the upper socket 70 and having the through-holes 131 formed at the positions corresponding to the lower terminals 41 of the upper package and the second conductive parts 71 of the upper socket; and the peripheral guide member 140 shaped to surround the conductive guide member 130 and having the insertion groove 141 at the center thereof so that the conductive guide member 130 is inserted into the insertion groove 141.

As illustrated in FIGS. 7A-7B, the conductive guide member 130 has a sheet shape and is made of an inelastic insulating material such as polyimide (PI) film, FR4, or engineering plastic. The conductive guide member 130 has the plurality of through-holes 131.

The first vacuum space portion 132 having a concave groove shape is formed in the lower surface of the conductive guide member 130 that faces the conductive region part A of the upper surface 74 of the upper socket 70. The first vacuum space portion 132 is formed by etching a lower surface of an inelastic insulating material having a sheet shape. The first vacuum space portion 132 may be formed in a shape having an 'H'-shaped groove or in a cross shape having H-shaped grooves intersecting each other. The first vacuum space portion 132 may have various shapes as long as the first vacuum space portion 132 may transfer the vacuum pressure.

In addition, a first deformation prevention portion 133 may be formed between the first vacuum space portions 132 and have a height that compensates for the concave groove. The first deformation prevention portion 133 may be a portion remaining between the first vacuum space portions 132 without being etched during the process of forming the first vacuum space portion 132. The first deformation prevention portion 133 may serve to improve durability of the inelastic insulating material and prevent deformation.

As described above, because the conductive guide member 130, which comes into contact with the lower terminals 41 of the upper package is made of an inelastic insulating material, it is possible to basically prevent a likelihood of a short circuit between the lower terminals 41 of the upper package and the conductive guide member 130.

In addition, because the conductive guide member 130 is made of an inelastic insulating material, the lower terminals 41 of the upper package softly come into contact with the conductive guide member 130, which makes it possible to prevent damage to the lower terminals 41 of the upper package in comparison with the case in which the conductive guide member is made of a metallic material in the related art.

As illustrated in FIGS. 8A-8B, the peripheral guide member 140 has a flat plate shape and is made of a metallic material. The insertion groove 141 into which the conductive guide member 130 is inserted is formed in the central portion of the peripheral guide member 140. The peripheral guide member 140 is shaped to surround the conductive guide member 130.

The second vacuum space portion 142 is formed in the lower surface of the peripheral guide member 140 that faces the peripheral region portion B of the upper surface 74 of the upper socket 70. The second vacuum space portion 142 has a concave groove shape through which the vacuum pressure is transferred through the vacuum hole 51 of the pusher 50. The second vacuum space portion 142 may be provided as a plurality of second vacuum space portions 142 formed by etching a lower surface of a metallic material having a flat plate shape. The drawing illustrates that the second vacuum space portions 142 are formed at left and right sides. However, the second vacuum space portions 142 may be formed at upper and lower sides. The second vacuum space portion 142 may have various shapes as long as the second vacuum space portion 142 may transfer the vacuum pressure.

In addition, a second deformation prevention portion 143 may be formed between the second vacuum space portions 142 and have a height that compensates for the concave groove. The second deformation prevention portion may be a portion remaining between the second vacuum space portions 142 without being etched during the process of etching the second vacuum space portion 142. The second deformation prevention portion 143 may serve to improve durability of the metallic material and prevent deformation.

As indicated by the arrow in FIG. 11, the vacuum line VL is formed by the vacuum pressure (suction pressure or release pressure) generated by the vacuum generation device VG. The vacuum pressure is transferred to the insulation pad hole 73 of the upper socket 70 through the vacuum hole 51 of the pusher 50, the chamber 52, the second vacuum space portion 142 of the peripheral guide member 140, and the first vacuum space portion 132 of the conductive guide member 130. The vacuum pressure transferred to the insulation pad hole 73 is transferred to the vacuum picker 80 coupled to the lower portion of the upper socket 70.

As described above, the peripheral guide member 140 made of a metallic material is formed as the portion to which the vacuum pressure transferred through the vacuum hole 51 of the pusher is directly applied, such that the peripheral guide member 140 has rigidity, which makes it possible to prevent the vacuum line from being deformed or eliminated. Therefore, it is possible to transfer sufficient vacuum pressure to the vacuum picker 80 and prevent a pick-up error when the vacuum picker 80 picks up the lower package 10.

As illustrated in FIGS. 9 and 10, the conductive guide member 130 is mounted on the lower surface of the upper package 40 on which the lower terminals are formed. The conductive guide member 130 is disposed to be in contact with the conductive region part A of the upper surface 74 of the upper socket 70. The peripheral guide member 140 is attached to the peripheral region portion B of the upper surface of the upper socket 70 via the bonding agent and disposed such that the conductive guide member 130 may be fitted with the insertion groove 141.

As described above, when the vacuum guide 150, which has the two components including the conductive guide member 130 and the peripheral guide member 140, is installed between the upper package 40 and the upper socket 70, the lower terminals 41 of the upper package and the second conductive parts 71 of the upper socket are connected into the through-holes 131 of the conductive guide member 130. Therefore, the conductive guide member 130 needs to have a thickness that allows the lower terminal 41 of the upper package and the second conductive part 71 of the upper socket to be connected to each other in the through-hole 131. However, the configuration in which the lower terminal 41 of the upper package is connected to the second conductive part 71 of the upper socket in the through-hole 131 in a state in which the lower terminal 41 compresses the second conductive part 71 is advantageous in terms of electric conductivity. Therefore, the thickness of the conductive guide member may be somewhat smaller than the thickness that allows the connection between the lower terminal 41 and the second conductive part 71.

A lower surface of the peripheral guide member 140 is attached to the peripheral region portion B of the upper surface of the upper socket 70 by means of a first bonding agent 171, and the edge portion of the lower surface of the upper package 40 may be bonded to an upper surface of the peripheral guide member 140 by means of a second bonding agent 172. Various bonding agents such as a double-sided tape or a liquid quick-drying bonding agent may be used as the bonding agent for bonding the upper package 40, the vacuum guide means 150, and the upper socket 70.

Therefore, an overall thickness t of the conductive guide member 130 may be a thickness made by summing up a thickness of the peripheral guide member 140, a thickness of the first bonding agent 171, and a thickness of the second bonding agent 172. Therefore, because the thickness of the conductive guide member 130 may be larger than the thickness of the peripheral guide member 140, a thickness of the through-hole 131, which supports and guides the second conductive part 71 of the upper socket 70, may be increased, and the entire upper bump 71c of the second conductive part 71 may be accommodated in the through-hole 131. Therefore, it is possible to prevent the deformation of the second conductive part 71 and implement the stable connection with the lower terminal 41 of the upper package.

Hereinafter, an operation of the apparatus 100 for testing a semiconductor package according to the embodiment of the present disclosure will be described.

As illustrated in FIGS. 4 and 11, the pusher 50 may be moved by the drive part (DP, 90), and the vacuum picker 80 may move downward and pick up the lower package 10.

The process of picking up the lower package 10 by the vacuum picker 80 is performed by the vacuum line VL formed by the vacuum pressure generated by the vacuum generation device VG. The vacuum pressure of the vacuum generation device is transferred to the vacuum picker 80 through the vacuum hole 51 of the pusher 50, the chamber 52, the second vacuum space portion 142 of the peripheral guide member 140, the first vacuum space portion 132 of the conductive guide member 130, and the insulation pad hole 73 of the upper socket 70 and used to pick up the lower package 10. FIG. 11 illustrates that the vacuum line VL formed in the test apparatus 100 according to the present disclosure is indicated by the arrow.

An appropriate vacuum region in the chamber 52, in which the vacuum picker 80 mounted on the upper socket 70 may move the lower package 10, may be 110 mm 3 or more, and the first vacuum space portion 132 and the second vacuum space portion 142 of the vacuum guide means 150 may be 9.5 mm 3 or more.

Next, the vacuum picker 80 may pick up the lower package 10 and transport the lower package 10 to a location above the lower socket 60. That is, the pusher 50 may approach the location above the lower package 10 positioned at the standby position, the vacuum picker 80 may move downward and pick up the lower package 10, and the pusher 50 may move to the location above the lower socket 60 and place the lower package 10 on the lower socket 60. In this case, the lower terminal 11 of the lower package 10 is disposed to be in contact with the first conductive part 61 of the lower socket 60.

Thereafter, when the pusher 50 moves toward the lower socket 60, the vacuum picker 80 pushes the lower package 10 while further moving downward, such that the lower terminal 11 of the lower package 10 is connected to the first conductive part 61 of the lower socket 60, and the second conductive part 71 of the upper socket 70 is connected to the upper terminal 12 of the lower package 10 by the movement of the pusher 50. In this case, a pressing force of the pusher 50 is transmitted to the lower package 10 through the upper socket 70, such that the tester 30, the lower socket 60, the lower package 10, the upper socket 70, and the upper package 40 are electrically connected.

In this case, the test signal generated by the tester 30 is transmitted to the upper package 40 through the lower socket 60, the lower package 10, and the upper socket 70, such that the electrical test may be performed on the upper package 40 and the lower package 10.

Further, the configuration in which the upper package 40 is configured as the golden device is advantageous in not only testing whether the lower package 10 operates normally, but also testing whether the lower package is properly matched with the upper package when the lower package and the upper package are stacked in a package-on-package manner.

In addition, the configuration in which the upper package 40 is configured as the golden device is advantageous in immediately ascertaining that the lower package 10 is a defective product when a defect occurs during the test. Of course, the upper package 40 may not be configured as the golden device. The upper package 40 may also be set as a test target, and the upper package 40 and the lower package 10 may be simultaneously tested.

After the test is completed, the vacuum picker 80 moves upward, and the lower package 10 picked by the vacuum picker 80 may be easily unloaded from the lower socket 60 by the motion of the pusher 50 and then transferred to the loading device (not illustrated).

As described above, according to the test apparatus according to the present disclosure, the second test circuit board disposed on the upper socket assembly in the related art may be removed, and the vacuum guide having the vacuum space portion is installed between the upper socket and the upper package, which makes it possible to ensure the vacuum line in the upper socket assembly and smoothly apply the vacuum pressure from the vacuum generation device to the vacuum picker.

In addition, the vacuum guide includes the two components including the conductive guide member and the peripheral guide member, and the conductive guide member made of an inelastic insulating material is disposed on the contact portion with the lower terminal of the upper package, which makes it possible to basically prevent a likelihood of occurrence of a short circuit between the vacuum guide means and the lower terminal of the upper package.

In addition, the vacuum guide includes the two components including the conductive guide member and the peripheral guide member, and the conductive guide member made of an inelastic insulating material is disposed on the contact portion with the lower terminal of the upper package, such that the lower terminal of the upper package may softly come into contact with the conductive guide member, which makes it possible to prevent damage to the lower terminal of the upper package in comparison with the case in which the conductive guide member is made of a metallic material in the related art.

In addition, the vacuum guide includes the two components including the conductive guide member and the peripheral guide member, and the peripheral guide member made of a metallic material having rigidity is disposed on the portion to which the vacuum pressure transferred through the vacuum hole of the pusher is directly applied, which makes it possible to prevent the vacuum line from being deformed or eliminated. Therefore, it is possible to transfer sufficient vacuum pressure to the vacuum picker and prevent a pick-up error when the vacuum picker picks up the lower package.

In addition, the vacuum guide may include the two components including the conductive guide member and the peripheral guide member, such that the thickness of the conductive guide member may be larger than the thickness of the peripheral guide member. Therefore, the thickness of the through-hole, which supports and guides the second conductive part of the upper socket, may be increased, and the entire upper bump of the second conductive part may be accommodated in the through-hole. Therefore, it is possible to prevent the deformation of the second conductive part and implement the stable connection with the lower terminal of the upper package.

In addition, the vacuum guide according to the present disclosure may be used instead of the second test circuit board in the related art, such that the length of the signal path between the upper package and the lower package is significantly decreased, which makes it possible to prevent the signal delay and signal distortion related to high-speed signal transmission and precisely test the semiconductor package that operates at high speed.

While the exemplary embodiments of the present disclosure have been described, the scope of the present disclosure is not limited to the illustrated and described embodiments.

DESCRIPTION OF REFERENCE NUMERALS 1, 100: Test apparatus
10: Lower package
30: Tester (First test circuit board)
40: Upper Package
50: Pusher
51: Vacuum hole
52: Chamber
60: Lower socket
70: Upper socket
71: Second conductive part
72: Insulation pad
73: Insulation pad hole
74: Upper surface of upper socket
80: Vacuum picket
90: Drive part (DP)
130: Conductive guide member
131: Through-hole
132: First vacuum space portion
133: First deformation prevention portion
140: Peripheral guide member
141: Insertion groove
142: Second vacuum space portion
143: Second deformation prevention portion
150: Vacuum guide

We claim:

1. A test apparatus comprising:
a lower socket mounted on a tester configured to provide a test signal, the lower socket comprising a plurality of first conductive parts configured to electrically connect a lower package to the tester by being connected to lower terminals of the lower package;
a pusher coupled to an upper package and having a vacuum hole through which vacuum pressure of a vacuum generation device is transferred, the pusher being configured to be movable toward or away from the lower socket by receiving power from a drive part;
an upper socket coupled to the pusher and including an insulation pad made of an inelastic insulating material, and a plurality of second conductive parts supported on the insulation pad and each of the plurality of second conductive parts comprising one end connected to a corresponding lower terminal of the upper package, and the other end of each of the plurality of second conductive parts connected to a corresponding upper terminal of the lower package, the upper socket having a conductive region part configured to surround the plurality of second conductive parts, and a peripheral region portion positioned at a periphery of the conductive region part;
a vacuum picker coupled to a lower portion of the upper socket and having an insulation pad hole formed at a center of the upper socket so that the vacuum pressure is transferred through the insulation pad hole; and
a vacuum guide means installed between the upper package and the upper socket, wherein the vacuum guide means comprises:
a conductive guide member comprising a region corresponding to the conductive region part and having through-holes formed at positions corresponding to the plurality of second conductive parts and corresponding to the lower terminals of the upper package, the conductive guide member comprising an inelastic insulating material; and
a peripheral guide member made of a metallic material and having an insertion groove into which the conductive guide member is inserted,
wherein a first vacuum space portion comprising a concave groove shape and connected to the vacuum hole is formed in a lower surface of the conductive guide member, and
wherein a second vacuum space portion comprising a concave groove shape and connected to the vacuum hole is formed in a lower surface of the peripheral guide member.

2. The test apparatus of claim 1, wherein the vacuum pressure of the vacuum generation device is applied to the vacuum picker through the vacuum hole, the second vacuum space portion, the first vacuum space portion, and the insulation pad hole.

3. The test apparatus of claim 1, wherein one or more deformation prevention portions are formed on the first vacuum space portion and the second vacuum space portion and each have a height that compensates for the concave groove.

4. The test apparatus of claim 1, wherein the conductive guide member has a thickness that allows the lower terminal of the upper package and the second conductive part to be connected to each other in one of the through-holes.

5. The test apparatus of claim 1, wherein a thickness of the conductive guide member is larger than a thickness of the peripheral guide member.

6. The test apparatus of claim 1, wherein the conductive guide member is mounted on a lower surface of the upper package, and the peripheral guide member is mounted on an upper surface of the upper socket.

7. The test apparatus of claim 1, wherein the inelastic insulating material is selected from the group consisting of polyimide film, FR4, and engineering plastic.

8. The test apparatus of claim 1, wherein the upper socket is coupled to a lower portion of the pusher in a vacuum sealing manner.

* * * * *